United States Patent [19]

Kuhara et al.

[11] Patent Number: 4,595,876

[45] Date of Patent: Jun. 17, 1986

[54] OPTICAL VOLTAGE AND ELECTRIC FIELD SENSOR

[75] Inventors: Yoshiki Kuhara; Koji Tada; Masami Tatsumi, all of Osaka; Yuuji Hamazaki, Kanagawa, all of Japan

[73] Assignee: Sumitomo Electric Industries, Ltd., Osaka, Japan

[21] Appl. No.: 397,009

[22] Filed: Jul. 12, 1982

[30] Foreign Application Priority Data

Jul. 27, 1981 [JP]   Japan .................................. 56-118257

[51] Int. Cl.⁴ .......................... G01R 31/00; G02F 1/03
[52] U.S. Cl. ........................................ 324/96; 324/72; 350/388
[58] Field of Search ............................ 324/96, 109, 72; 350/355, 356, 374, 375, 376, 377, 388

[56] References Cited

U.S. PATENT DOCUMENTS 2,467,325  4/1949  Mason ................................... 350/388
3,741,626  4/1973  Wentz ................................... 350/388

FOREIGN PATENT DOCUMENTS 2068137  8/1981  United Kingdom ................... 324/96

OTHER PUBLICATIONS

Nisenson et al, "Real Time . . . ", *Applied Optics*, vol. 11, No. 12, Dec. 1972, pp. 2760–2766.
Iguchi et al, "Electrically Controlled . . . ", Conference: Sixth European Conference on Optical Communication, York, England, Sep. 16–19, 1980, pp. 314–317.
Hamasaki et al, "OPSEF, an Optical . . . ", Electronics Letters, May 22, 1980, vol. 16, No. 11, pp. 406–407.

*Primary Examiner*—Ernest F. Karlsen
*Attorney, Agent, or Firm*—Sughrue, Mion, Zinn, Macpeak and Seas

[57] ABSTRACT

An optical voltage and electric field sensor for detecting the voltage or electric field applied to a device made of a single crystal of bismuth silicon oxide ($Bi_{12}SiO_{20}$) or bismuth germanium oxide ($Bi_{12}GeO_{20}$) is disclosed. The device comprises a plurality of crystal plates stacked in a direction perpendicular to the propagation direction of light, each plate having only one dimension reduced to a very small size.

14 Claims, 8 Drawing Figures

OPTICAL VOLTAGE AND ELECTRIC FIELD SENSOR

FIELD OF THE INVENTION

This invention relates to a broad-band optical voltage and electric field sensor using a bismuth silicon oxide $Bi_{12}SiO_{20}$ (hereunder referred to as BSO) or a bismuth germanium oxide $Bi_{12}GeO_{20}$ (hereunder referred to as BGO) device.

BACKGROUND OF THE INVENTION

FIG. 1 is a schematic diagram of a vertically oriented optical voltage and electric field sensor wherein light travels and a voltage or electric field is applied in a direction of <100>. In the figure, the numeral 1 indicates an optical fiber, 2 is a rod lens, 3 is a polarizer, 4 is a quarter-wave plate, 5 is a BSO or BGO device, 6 is an analyzer and 7 is an input voltage source. The following description is directed to a BSO device, it being indicated that the same explanation applies to a BGO device.

After falling on optical fiber 1, light passes through rod lens 2, polarizer 3 and quarter-wave plate 4, and falls on BSO device 5 having a transparent electrode formed on front and back sides. The light is polarized according to the voltage level applied to BSO device 5 from input voltage source 7 through the electrodes. The sensor uses the change in polarized state to detect the intensity of the input voltage or electric field.

FIG. 2 shows a BSO device 8 and an input voltage source 7 in a horizontally oriented optical voltage and electric field sensor configuration wherein light travels in a direction of <100> whereas a voltage or electric field is applied in a direction of <1$\bar{1}$0>. The other components of the sensor are identical to those illustrated in FIG. 1.

FIG. 3 is a frequency characteristic curve for the modulation sensitivity of a conventional optical voltage and electric field sensor using a BSO device. When the frequency of the voltage or electric field applied to a conventional sensor is increased, piezoelectric effect occurs at certain frequencies and mechanical resonance develops in the BSO device. The resulting mechanical stress affects the refractive index of the BSO device. In consequence, as shown in FIG. 3, the frequency characteristic curve for the modulation sensitivity of a conventional sensor has very high peaks a, b and c at certain frequencies. Therefore, the conventional sensor cannot be used in analysis of a phenomenon such as high-voltage surge that requires a constant modulation sensitivity up to high frequency components.

SUMMARY OF THE INVENTION

A primary object of the present invention is to provide an optical voltage and electric field sensor using a BSO device or BGO device that is free from resonance and which can be operated over a broad range of frequencies.

In accordance with the present invention, an optical voltage and electric field sensor is provided for detecting the voltage or electric field applied to the device comprising a plurality of thin crystal plates stacked in a direction perpendicular to the travelling direction of incident light. The crystals may be BSO or BGO and have a thickness of not more than 0.8 mm in the stacking direction.

The present invention is hereunder described in detail by reference to the accompanying drawings and the description of the preferred embodiment that follows.

DESCRIPTION OF THE PREFERRED EMBODIMENT

Figure 1:
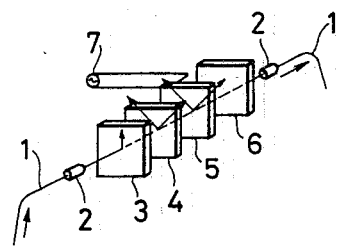
FIG. 1 is a schematic diagram of a vertically oriented optical voltage and electric field sensor.
Figure 2:
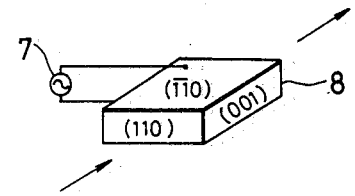
FIG. 2 is a schematic diagram of a BSO horizontally oriented optical voltage and electric field sensor.
Figure 3:
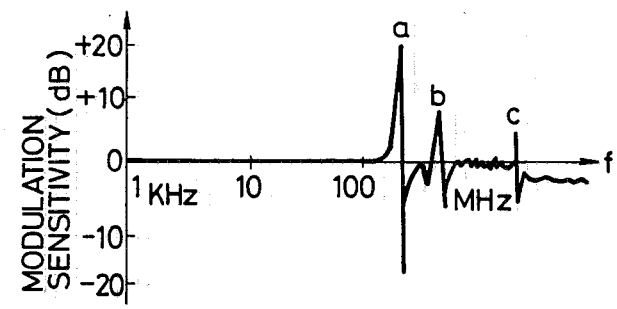
FIG. 3 is a frequency characteristic curve illustrating the modulation sensitivity of a conventional sensor.
Figure 4A:
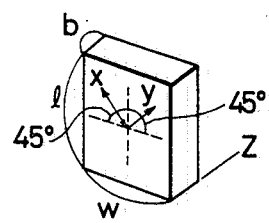
FIGS. 4A and 4B illustrate the piezoelectric effect and shear mode respectively of a BSO crystal.
Figure 4B:
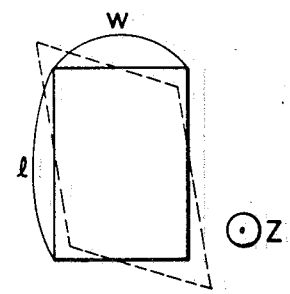

FIG. 4A illustrates the relation between the shape of the BSO device height (l)×width (w)×thickness (b). The inventors made an analysis of the reasons why the piezoelectric effect developed resonance in a BSO device, and found that the mode of vibration is a "shear mode" as represented by the solid and broken lines in FIG. 4B. This means that when a BSO crystal is used in the coordinate system as shown in FIG. 4A, the piezoelectric effect occurring in the crystal causes vibration of a "shear mode" on the x-y plane, and the vibration is not significantly a function of or dependent on the thickness (b) in z-axis.

It is known that the resonant frequency for the vibration in shear mode can be approximated by the following equation:

$$f_R = \tfrac{1}{2}\sqrt{\frac{C_{44}}{\rho}} \cdot \sqrt{\frac{m^2}{l^2} + \frac{n^2}{w^2}} \tag{1}$$

where m, n = 1, 2, 3, ...

In a fundamental mode (m = n = 1), the resonant frequency is:

$$f_0 = \tfrac{1}{2}\sqrt{\frac{C_{44}}{\rho}} \cdot \sqrt{\frac{1}{l^2} + \frac{1}{w^2}} \tag{2}$$

wherein $\rho$ is the specific gravity, $C_{44}$ is the piezoelectric stiffness, l and w are the height and width of the BSO device, respectively. For BSO, $C_{44}$ is about $0.25 \times 10^{11}$ (N/m$^2$) and $\rho$ is about $9.2 \times 10^3$ (kg/m$^3$). Table 1 shows the calculated and experimentally derived values of the resonant frequency.

TABLE 1

| Size of BSO Device (l × w × b) (mm) | Resonant Frequency Calculated (kHz) | Experimentally Derived (kHz) |
|---|---|---|
| (1) 7 × 5 × 2 | 203 | 175 |
| (2) 7 × 3 × 2 | 298 | 245 |
| (3) 4 × 3 × 2 | 343 | 300 |
| (4) 7 × 5 × 1 | 203 | 179 |
| (5) 1 × 1 × 1 | 1000 | 1030 |

As Table 1 shows, the experimental values are in fairly good agreement with the calculated values with experimental accuracy. In Table 1, the resonant frequency for BSO device samples (1) and (4) that differ only in thickness yet are nearly identical with respect to both calculated values and experimental values. It is therefore concluded that the height and width of a BSO device are preferably reduced to minimum to increase the resonant frequency.

In high voltage electrical and electronic apparatus, a "standard impulse waveform" having a rise time of 1 sec and a fall time of 40 μsec is frequently used. To measure the standard impulse waveform with the optical voltage and electric field sensor of the type contemplated by the present invention, the resonant frequency must be 500 kHz or higher, preferably 1 MHz or higher. It can be seen from Table 1 that a resonant frequency higher than 1 MHz can be attained by making the height and width of the BSO device smaller than 1 mm. However, such a small BSO device is difficult to combine and match with other optical components. Moreover, the amount of light (a flux of light is generally from about 1.5 to 2.0 mm in diameter) that passes through the BSO device is reduced to thereby decrease the S/N ratio.

The present invention provides a BSO or BGO device free from such a defect. In the prior art, the resonant frequency has been increased by reducing both (l) and (w) in equation (2), but according to the study of the inventors, by reducing either dimension (l) or (w) to a very small size, the resonant frequency can be increased while the other dimension is kept large enough to not adversely affect the assembling and adjustment of the device. The area of the device through which light can pass is, however, reduced to the extent that only a very small portion of the luminous flux is utilized. Consequently, the S/N ratio, hence detection sensitivity is reduced. Given this shortcoming, continued research on various methods to avoid this problem was necessary. The inventors discovered that this problem can be eliminated by stacking BSO devices with an extremely small length or width in a direction perpendicular to the propagation direction of light.

Figure 5:
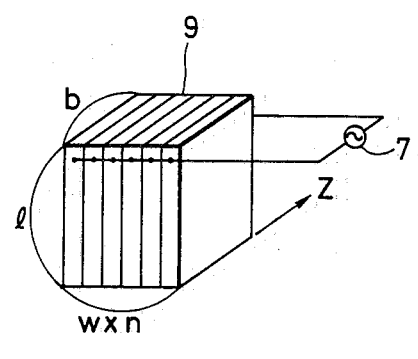
FIG. 5 is a schematic perspective view of a BSO device in accordance with the present invention.

Referring now to FIG. 5, a schematic diagram of a BSO device 9 according to the present invention is shown. In FIG. 5, a plurality (n) of BSO plates having a width (w), height (l) and thickness (b) are stacked side by side. In this arrangement, the individual BSO plates exhibit a high frequency that is substantially determined by their width and at the same time, they provide an area on which light falls that is as large as the area achieved in the conventional sensor. Hence, there is no reduction in sensitivity due to low S/N ratio. Another advantage of the overall size of the BSO device is (l)×(w×n)×(b) that is a function of (n) and this permits easy assembly and adjustment of the device.

To demonstrate the advantages of the arrangement of FIG. 5, a BSO device was fabricated by stacking eight BSO plates (w=0.6 mm, l=7 mm, b=2 mm) each having a transparent electrode formed on both front and back sides. Light falls on the device in an area measuring (0.6 mm×8×7 mm=4.8 mm×7 mm). So that the device could be combined and matched with other optical components into an optical voltage and electric field sensor as easily as a conventional one-piece BSO device measuring 5 mm×7 mm. Although an acetate vinyl adhesive was used to bond the individual BSO plates, little vibrational interference between each plate was encountered, and the resonant frequency ($f_O$) was about 1.3 MHz in comparison with the calculated value ($f_O$) of 1.2 MHz for a size of w=0.6 mm and l=7 mm. Therefore, a vertical optical voltage and electric field sensor having a resonant frequency of 1 MHz or higher can be easily fabricated using the BSO device of the present invention. The device exhibited little light transmission loss due to the adhesive since the total thickness of the adhesive layers was less than 20 micrometers.

The light passing through the adhesive layers is not subjected to modulation by voltage and hence becomes a noise component, but with the BSO device prepared according to the present invention, there was little reduction in S/N ratio due to such transmitted light. It is recognized, however, that best results are obtained by using a light-absorbing (opaque) adhesive. To minimize the vibrational interference occurring between each BSO plate, it is preferred that the individual adhesive layers be loosely bonded to the BSO plates. Any adhesive in addition to the vinyl acetate adhesive can be used if it satisfies this requirement. The above results also show that the width of each BSO plate should not exceed 0.8 mm to achieve a resonant frequency of 1 MHz or higher.

Figure 6:
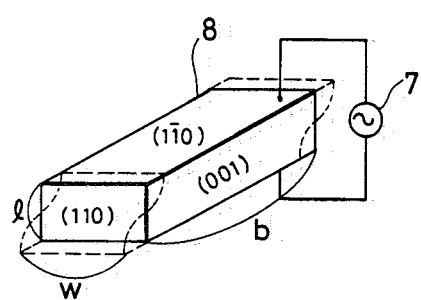
FIG. 6 is a schematic diagram illustrating the shear mode of a horizontal type BSO device.

The present inventors made the same analysis and experiment with a horizontal optical voltage and electric field sensor and found that the mode of vibration occurring in the horizontal type is a thickness shear mode as indicated by the solid and broken lines in FIG. 6. The resonant frequency for a fundamental mode ($f_O$) is represented by:

$$f_O = \frac{1}{2l} \sqrt{\frac{Ck}{\rho}} \tag{3}$$

wherein: Ck is the piezoelectric stiffness characteristic of the direction of thickness, which in case of a BSO crystal was found to be substantially equal to the value of $C_{44}$.

According to the inventors' analysis, the resonant frequency ($f_O$) was 400 kHz when a BSO plate had a length of 2 mm to permit a luminous flux 1.5 to 2 mm in diameter to pass through without loss. Again, the length of the BSO plate must be further decreased preferably down to 0.8 mm or lower to achieve a resonant frequency of 1 MHz or higher. Then, however, the same problem as with the vertical type sensor occurs.

Figure 7:
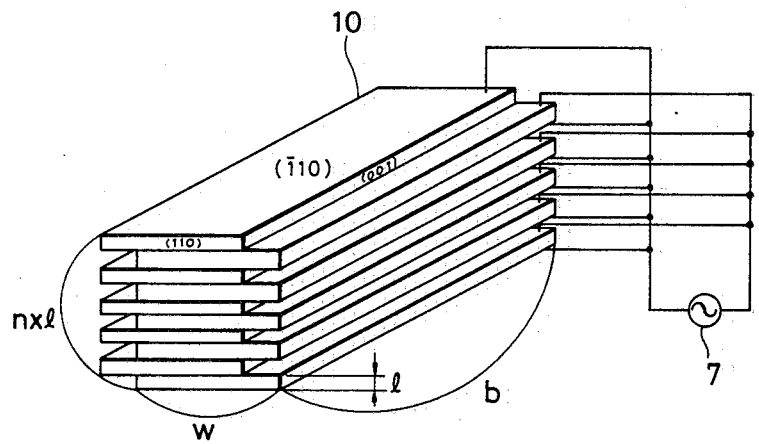
FIG. 7 is a schematic perspective view illustrating a second type of BSO device in accordance with this invention.

To eliminate this problem, the inventors fabricated a BSO device comprising a plurality of BSO plates having an extremely small height that were stacked on top of one another as shown in FIG. 7. In this arrangement, the electrode on the bottom side of a BSO plate contacts the electrode on the top side of an adjacent underlying plate, so the polarity of the voltage applied must be such that the two electrodes in contact with each other have the same polarity, that is, (+−)(−+)(+−) . . . (+−)(−+).

To demonstrate the advantages of the embodiment of FIG. 7, the inventors tested a BSO device fabricated by stacking eight BSO plates one on top of another. Each plate measured l=0.6 mm, w=7 mm and b=10 mm and having a gold electrode formed on a (1$\bar{1}$0) plane. The resulting BSO device had a resonant frequency ($f_O$) of 1.3 MHz which was equal to the value achieved by the vertical type sensor.

The same results were obtained not only for voltage but also for electric field. The results were also the same if the BSO device was replaced by a BGO device.

As described herein, according to the present invention, an optical voltage and electric field sensor having higher resonant frequencies can be operated over a broader range of frequencies is provided by using a device wherein a plurality of crystal plates with only one dimension reduced to an extremely small size are stacked in a direction perpendicular to the travelling direction of light.

It is apparent that modifications of this invention may be practiced without departing from the essential scope of this invention.

What is claimed is:

1. An optical voltage and electric field sensor composed of a plurality of single crystal plates of $Bi_{12}XO_{20}$ each having a thin thickness in a direction of $<\bar{1}\,1\,0>$ wherein X is selected from a group consisting of Si or Ge, comprising: said plates being stacked in a direction of $<\bar{1}\,1\,0>$ and in parallel with the direction of incident light, and the voltage or the electric field to be detected being applied to said stacked plates in a direction of $<\bar{1}\,1\,0>$ which direction is vertical to the direction of incident light.

2. A sensor according to claim 1, wherein the individual crystal plates have a thickness of not more than 0.8 mm in the direction in which they are stacked.

3. The sensor according to claims 1 or 2, wherein said crystal plates each have substantially the same dimensions.

4. The sensor according to claim 3, wherein said crystal plates are stacked in an off-set arrangement with alternate crystals aligned with each other.

5. The sensor according to claims 1 or 2, further comprising a voltage source and electrodes arranged to contact adjacent contacting surfaces of said crystal plates.

6. The sensor of claims 1 or 2 further comprising adhesive means to bond crystal plates to each other.

7. The sensor of claim 6, wherein said adhesive is a light absorbing vinyl acetate.

8. An optical voltage and electric field sensor composed of a plurality of single crystal plates of $Bi_{12}XO_{20}$ each having a thin thickness in a direction of $<1\,0\,0>$ wherein X is selected from the group consisting of Si or Ge, comprising: said plates being stacked in a direction of $<1\,0\,0>$ which direction is vertical to the direction of incident light, and the voltage or the electric field to be detected being applied to said stacked plates in a direction of $<0\,1\,0>$ which direction is parallel to the direction of incident light.

9. A sensor according to claim 8, wherein the individual crystal plates have a thickness of not more than 0.8 mm in the direction in which they are stacked.

10. A sensor according to claim 9, wherein said crystal plates each have substantially the same dimensions.

11. A sensor according to claim 9, further comprising adhesive means to bond crystal plates to each other.

12. A sensor according to claim 8, wherein said crystal plates each have substantially the same dimensions.

13. A sensor according to claim 8, further comprising adhesive means to bond crystal plates to each other.

14. A sensor according to claim 13, wherein said adhesive is a light absorbing vinyl acetate.

* * * * *